United States Patent
Park et al.

(10) Patent No.: US 12,520,646 B2
(45) Date of Patent: Jan. 6, 2026

(54) DISPLAY DEVICE USING SEMICONDUCTOR LIGHT-EMITTING ELEMENT

(71) Applicant: LG ELECTRONICS INC., Seoul (KR)

(72) Inventors: Sungyun Park, Seoul (KR); Dohan Kim, Seoul (KR); Soohyun Kim, Seoul (KR); Sungmin Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 725 days.

(21) Appl. No.: 17/793,209

(22) PCT Filed: Jan. 21, 2020

(86) PCT No.: PCT/KR2020/000981
§ 371 (c)(1),
(2) Date: Jul. 15, 2022

(87) PCT Pub. No.: WO2021/145498
PCT Pub. Date: Jul. 22, 2021

(65) Prior Publication Data
US 2023/0064316 A1 Mar. 2, 2023

(30) Foreign Application Priority Data
Jan. 16, 2020 (KR) .................. 10-2020-0006106

(51) Int. Cl.
*H10H 29/14* (2025.01)
*H10H 20/01* (2025.01)
(Continued)

(52) U.S. Cl.
CPC ........ *H10H 29/142* (2025.01); *H10H 20/018* (2025.01); *H10H 20/856* (2025.01); *H10H 20/857* (2025.01); *H10H 20/832* (2025.01)

(58) Field of Classification Search
None
See application file for complete search history.

(56) References Cited

U.S. PATENT DOCUMENTS 6,683,416 B1    1/2004  Oohata et al.
2014/0339495 A1*  11/2014  Bibl ................ H10H 20/812
                                                257/13
(Continued)

FOREIGN PATENT DOCUMENTS

KR    10-2017-0022755    3/2017
KR    10-2017-0117282   10/2017
(Continued)

OTHER PUBLICATIONS

Park et al., 'Comparative Investigation of Transparent ITO/Ag/ITO and ITO/Cu/ITO Electrodes Grown by Dual-Target DC Sputtering for Organic Photovoltaics', Journal of The Electrochemical Society, 156 (7) H588-H594, 2009. (Year: 2009).*

(Continued)

Primary Examiner — Feifei Yeung Lopez
(74) Attorney, Agent, or Firm — LEE, HONG, DEGERMAN, KANG & WAIMEY

(57) ABSTRACT

A display device of the present invention relates to a structure for bottom emission, comprising: a base part; assembly electrodes which extend in one direction and which are formed on the base part; a dielectric layer formed to cover the assembly electrodes; a barrier rib part which has a plurality of cells, and which is stacked on the dielectric layer; and semiconductor light-emitting elements loaded in the cell, wherein the assembly electrodes include a metal electrode part formed of a metal material and a transparent electrode part formed of a transparent material.

12 Claims, 15 Drawing Sheets

(51) Int. Cl.
    *H10H 20/856*      (2025.01)
    *H10H 20/857*      (2025.01)
    *H10H 20/832*      (2025.01)

(56) References Cited

U.S. PATENT DOCUMENTS

| | | |
|---|---|---|
| 2017/0294451 A1 | 10/2017 | Kim et al. |
| 2018/0122836 A1* | 5/2018 | Kang .................. H10D 86/451 |
| 2019/0326477 A1 | 10/2019 | Kim et al. |
| 2022/0068876 A1* | 3/2022 | Do ........................ H10H 20/01 |
| 2022/0209085 A1* | 6/2022 | Tamaki ............... H01L 25/0753 |
| 2022/0254961 A1 | 8/2022 | Chang et al. |

FOREIGN PATENT DOCUMENTS

| | | |
|---|---|---|
| KR | 10-2018-0011404 | 2/2018 |
| KR | 10-2018-0015940 | 2/2018 |
| KR | 10-2019-0104277 | 9/2019 |
| KR | 10-2019-0106885 | 9/2019 |

OTHER PUBLICATIONS

European Patent Office Application Serial No. 20914667.9, Search Report dated Jan. 30, 2024, 7 pages.
PCT International Application No. PCT/KR2020/000981, International Search Report dated Oct. 15, 2020, 4 pages.
Korean Intellectual Property Office Application No. 10-2020-0006106, Notice of Allowance dated Feb. 19, 2025, 7 pages.

\* cited by examiner

DISPLAY DEVICE USING SEMICONDUCTOR LIGHT-EMITTING ELEMENT

CROSS-REFERENCE TO RELATED APPLICATIONS

This application is the National Stage filing under 35 U.S.C. 371 of International Application No. PCT/KR2020/000981, filed on Jan. 21, 2020, which claims the benefit of earlier filing date and right of priority to Korean Application No. 10-2020-0006106, filed on Jan. 16, 2020, the contents of which are all incorporated by reference herein in their entirety.

TECHNICAL FIELD

The present disclosure relates to a display device using a semiconductor light emitting diode, and in particular, to a display device using a semiconductor light emitting diode having a size of several to several tens of μm.

BACKGROUND ART

Recently, liquid crystal displays (LCD), organic light-emitting diode (OLED) displays, and micro LED displays are competing to implement a large-area display in the field of display technology.

Meanwhile, if a semiconductor light emitting diode (micro LED) having a cross-sectional area or diameter of 100 μm or less is used in the display, the display does not absorb light using a polarizing plate or the like, and thus, very high efficiency can be provided. However, since a large display requires millions of semiconductor light emitting diodes, it is difficult to transfer the elements, compared to other technologies.

Examples of a technology that is currently being developed as a transfer process include pick & place, laser lift-off (LLO), or self-assembly. Among them, the self-assembly is a method in which a semiconductor light emitting diode finds its own position in a fluid, and is the most advantageous method for realizing a large-screen display device.

The self-assembly includes a method of directly assembling a semiconductor light emitting diode on a final substrate to be used in a product, and a method of assembling a semiconductor light emitting diode on an assembly substrate and then transferring the semiconductor light emitting diode to a final substrate through an additional transfer process. The method of directly assembling on the final substrate is efficient in terms of process. The use of the assembly substrate has an advantage in that a structure for self-assembly can be added without limitation. Therefore, the two methods are selectively used.

DISCLOSURE

Technical Problem

One object of the present disclosure is to provide a display device having a structure in which bottom light emission is possible. To this end, the present disclosure provides a structure in which a semiconductor light emitting diode seated in a cell overlaps a transparent electrode portion of an assembled electrode.

In addition, another object of the present disclosure is to provide a display device having a structure capable of minimizing light loss during bottom emission. To this end, the present disclosure provides a planarization layer formed of a reflective material on the semiconductor light emitting diode.

Technical Solution

A display device according to the present disclosure includes a base portion; assembled electrodes extending in one direction and formed on the base portion; a dielectric layer formed to cover the assembled electrodes; a partition wall portion stacked on the dielectric layer while forming a plurality of cells; and semiconductor light emitting diodes seated in the cell, in which the assembled electrodes include a metal electrode portion formed of a metal material and a transparent electrode portion formed of a transparent material.

In an embodiment of the present disclosure, the transparent electrode portion is formed in a region overlapping at least the semiconductor light emitting diode.

In an embodiment of the present disclosure, the cell overlaps the transparent electrode portion of the assembled electrode.

In an embodiment of the present disclosure, the metal electrode portion is continuously formed along a direction in which the assembled electrode is extended.

In an embodiment of the present disclosure, the assembled electrodes include a connection portion formed so that the metal electrode portion and the transparent electrode portion overlap each other at a boundary thereof.

In an embodiment of the present disclosure, the connection portion is formed so that the metal electrode portion covers a portion of an upper surface of the transparent electrode portion.

In an embodiment of the present disclosure, the semiconductor light emitting diode includes a first conductivity type electrode; a first conductivity type semiconductor layer on which the first conductivity type electrode is formed; an active layer formed on the first conductivity type semiconductor layer; a second conductivity type semiconductor layer formed on the active layer; and a second conductivity type electrode spaced apart from the first conductivity type electrode in a horizontal direction on the second conductivity type semiconductor layer.

In an embodiment of the present disclosure, the display device further includes a planarization layer formed to cover the partition wall portion and the semiconductor light emitting diode seated on the cell.

In an embodiment of the present disclosure, the planarization layer is formed of a white insulator.

In an embodiment of the present disclosure, the planarization layer includes a coating layer formed of a reflective non-conductive material.

In an embodiment of the present disclosure, the base portion is formed of a light-transmitting material.

In an embodiment of the present disclosure, the display device further includes a wiring electrode formed on the base portion and electrically connected to the semiconductor light emitting diode.

Advantageous Effect

In the display device according to an embodiment of the present disclosure, there is an effect that the semiconductor light emitting diode overlaps the transparent electrode portion of the assembled electrode to enable bottom light emission and the light emitting area of the semiconductor light emitting diode can be maximized.

In addition, according to the embodiment of the present disclosure, the planarization layer covering the semiconductor light emitting diode and the partition wall portion is formed of a reflective material, thereby maximizing the amount of light reflected to the rear surface of the substrate to minimize light loss.

BEST MODE

Figure 1:
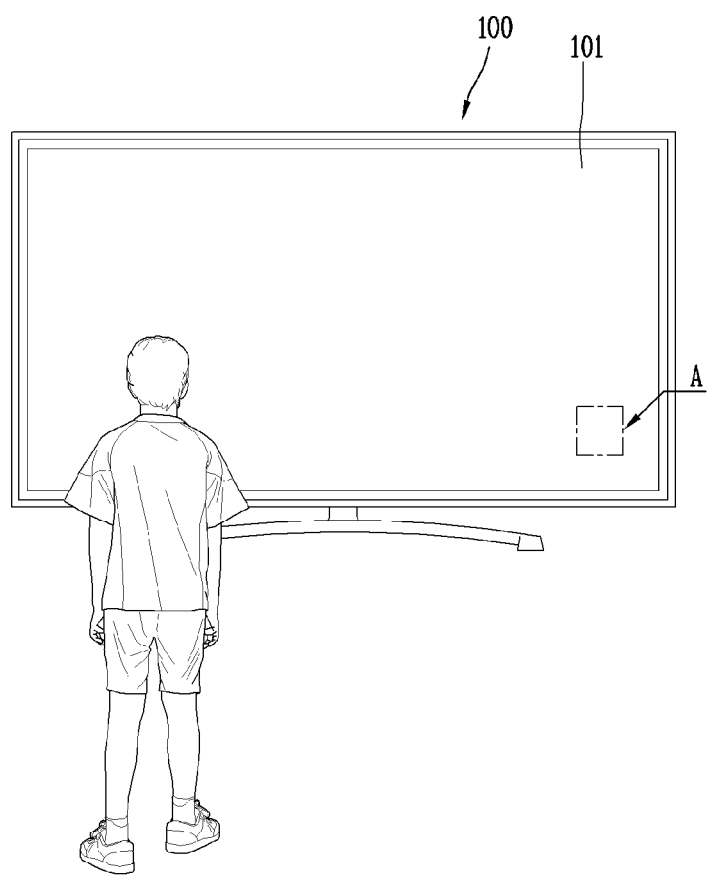
FIG. 1 is a conceptual diagram illustrating an embodiment of a display device using a semiconductor light emitting diode of the present disclosure.

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function. In addition, when it is determined that the detailed description of the related known technology may obscure the gist of embodiments disclosed herein in describing the embodiments, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings. It is also understood that when an element, such as a layer, region, or substrate, it is referred to as being "on" another element, it may be directly present on the other element or intervening elements in between.

The display device described herein may include mobile phones, smart phones, laptop computers, digital broadcasting terminals, personal digital assistants (PDA), portable multimedia players (PMP), navigation systems, slate PCs, a Tablet PC, Ultra Books, digital TVs, digital signages, head mounted displays (HMDs), desktop computers, and the like. However, it will be readily apparent to those skilled in the art that the configuration according to the embodiments described in the present specification may be applied to a device capable of display having even a new product form to be developed later.

Figure 2:
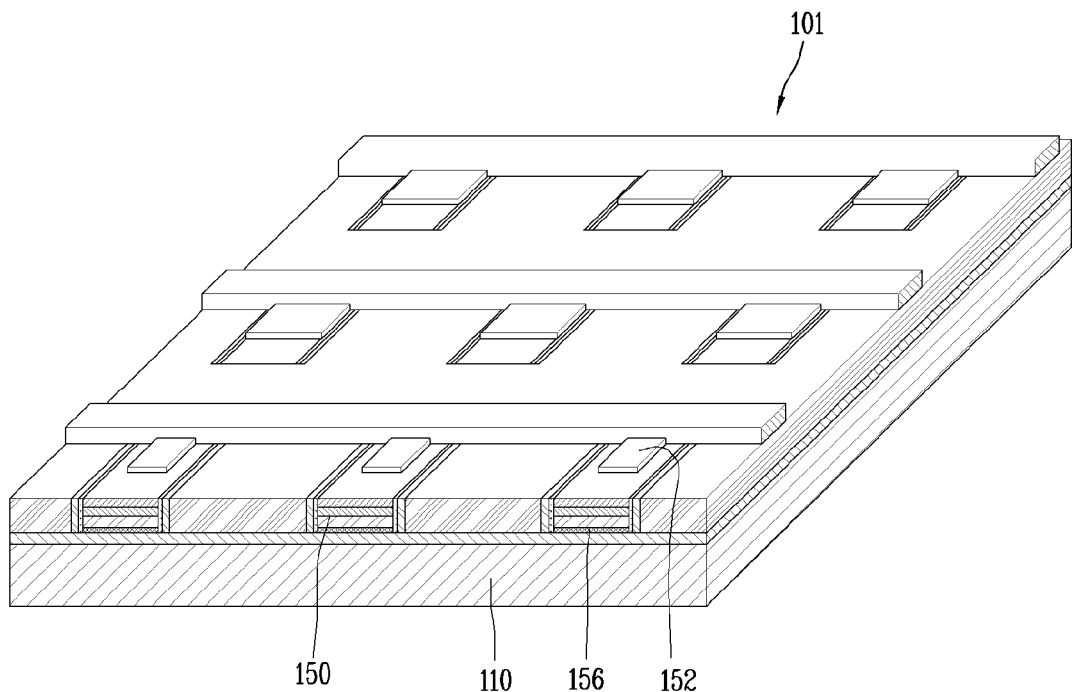
FIG. 2 is a partially enlarged view of portion A of the display device of FIG. 1.
Figure 3:
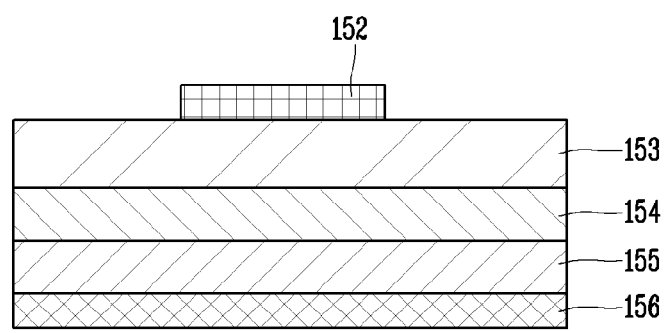
FIG. 3 is an enlarged view of the semiconductor light emitting diode of FIG. 2.
Figure 4:
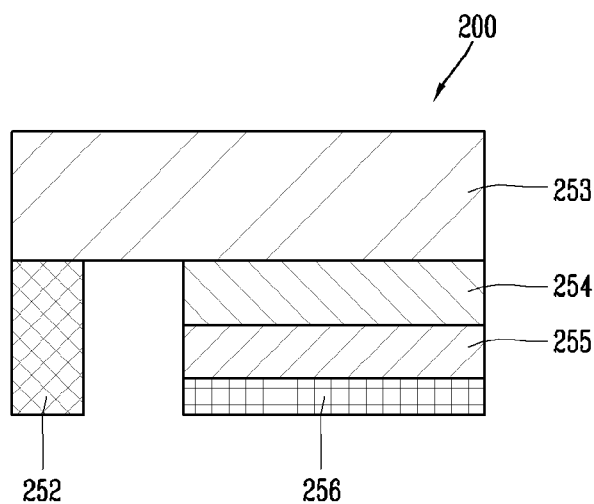
FIG. 4 is an enlarged view illustrating another embodiment of the semiconductor light emitting diode of FIG. 2.

FIG. 1 is a conceptual diagram illustrating an embodiment of a display device using a semiconductor light emitting diode of the present disclosure, FIG. 2 is a partially enlarged view of portion A of the display device of FIG. 1, FIG. 3 is an enlarged view of the semiconductor light emitting diode of FIG. 2, and FIG. 4 is an enlarged view illustrating another embodiment of the semiconductor light emitting diode of FIG. 2.

As illustrated, information processed by a controller of a display device 100 may be output from a display module 140. A closed-loop-type case 101 surrounding edges of the display module may form a bezel of the display device.

The display module 140 may include a panel 141 on which images are displayed, and the panel 141 may include a micro-sized semiconductor light emitting diode 150 and a wiring board 110 on which the semiconductor light emitting diode 150 is mounted.

Wirings may be formed on the wiring board 110 to be connected to an n-type electrode 152 and a p-type electrode 156 of the semiconductor light emitting diode 150. Through this, the semiconductor light emitting diode 150 may be provided on the wiring board 110 as an individual pixel that emits light itself.

An image displayed on the panel 141 is visual information, and is implemented by independently controlling light emission of sub-pixels arranged in a matrix form through the wirings.

In the present disclosure, a micro LED (Light Emitting Diode) is exemplified as a type of the semiconductor light emitting diode 150 that converts current into light. The micro LED may be a light emitting diode formed in a small size of 100 micro or less. In the semiconductor light emitting diode 150, blue, red, and green colors are provided in light emitting regions, respectively, and a unit pixel may be realized by a combination thereof. That is, the unit pixel may mean a minimum unit for realizing one color, and at least three micro LEDs may be provided in the unit pixel.

More specifically, referring to FIG. 3, the semiconductor light emitting diode 150 may have a vertical structure.

For example, the semiconductor light emitting diode 150 is mainly made of gallium nitride (GaN), and indium (In) and/or aluminum (Al) are added together to implement a high output light emitting diode that emits various lights including blue.

The vertical semiconductor light emitting diode may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned in a lower portion may be electrically connected to the p-electrode of the wiring board, and the n-type electrode 152 positioned in an upper portion may be electrically connected to the n-electrode at the upper side of the semiconductor light emitting diode. The vertical semiconductor light emitting diode 150 has a great advantage in that it is possible to reduce the chip size because electrodes are arranged up and down.

As another example, referring to FIG. 4, the semiconductor light emitting diode may be a flip chip type light emitting diode.

For this example, the semiconductor light emitting diode 250 may include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and n-electrode of the wiring board under the semiconductor light emitting diode.

The vertical semiconductor light emitting diode and the horizontal semiconductor light emitting diode may be a green semiconductor light emitting diode, a blue semiconductor light emitting diode, or a red semiconductor light emitting diode, respectively. In the case of the green semiconductor light emitting diode and the blue semiconductor light emitting diode, gallium nitride (GaN) is mainly used, and indium (In) and/or aluminum (Al) are added together to implement a high output light emitting diode that emits green or blue light. For this example, the semiconductor light emitting diode may be a gallium nitride thin film formed in various layers such as n-Gan, p-Gan, AlGaN, InGan, etc. Specifically, the p-type semiconductor layer may be P-type GaN, and the n-type semiconductor layer may be N-type GaN. However, in the case of the red semiconductor light emitting diode, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the above-described semiconductor light emitting diodes may be semiconductor light emitting diodes having no active layer.

Meanwhile, referring to FIGS. 1 to 4, since the light emitting diodes are very small, unit pixels that emit light themselves may be arranged in a high definition in the display panel, thereby realizing a high-definition display device.

In the display device using the semiconductor light emitting diode of the present disclosure described above, the semiconductor light emitting diode grown on a wafer and formed through mesa and isolation is used as an individual pixel. In this case, the micro-sized semiconductor light emitting diode 150 needs to be transferred to the wafer at a predetermined position on a substrate of the display panel. There is a pick and place technique as such a transfer technique, but the success rate is low and a lot of time is required. As another example, there is a technique of transferring several devices at a time using a stamp or a roll, but it is not suitable for a large screen display due to a limitation in yield. The present disclosure proposes a new manufacturing method and manufacturing apparatus for a display device that can solve these problems.

To this end, a new method of manufacturing a display device will be described below. FIGS. 5A to 5E are conceptual views for describing a new process of manufacturing the semiconductor light emitting diode.

In the present specification, a display device using a passive matrix (PM) type semiconductor light emitting diode is taken as an example. However, the examples described below are also applicable to an active matrix (AM) type semiconductor light emitting diode. In addition, although a method of self-assembling a horizontal semiconductor light emitting diode is described as an example, it is also applicable to a method of self-assembling a vertical semiconductor light emitting diode.

Figure 5A:
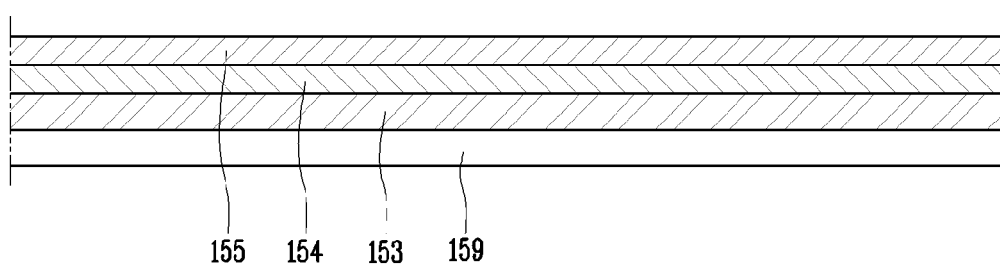
FIGS. 5A to 5E are conceptual views for describing a new process of manufacturing the semiconductor light emitting diode.

First, according to the manufacturing method, a first conductivity type semiconductor layer 153, an active layer 154, and a second conductivity type semiconductor layer 155 are individually grown on a growth substrate 159 (FIG. 5A).

After the first conductivity type semiconductor layer 153 is grown, the active layer 154 is grown on the first conductivity type semiconductor layer 153, and then the second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5a, the first conductivity type semiconductor layer 153, the active layer 154 and the second conductive semiconductor layer 155 form a stacked structure.

In this case, the first conductivity type semiconductor layer 153 may be a p-type semiconductor layer, and the second conductivity type semiconductor layer 155 may be an n-type semiconductor layer. However, the present disclosure is not necessarily limited thereto, and the first conductivity type may be n-type and the second conductivity type may be p-type.

In addition, although the present embodiment exemplifies the case in which the active layer is present, a structure in which the active layer is not present is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al2O3), GaN, ZnO, and AlO, but is not limited thereto. In addition, the growth substrate 159 may be formed of a material suitable for semiconductor material growth, a carrier wafer. The growth substrate 159 may be formed of a material having excellent thermal conductivity, and may include a conductive board or an insulating board, for example, a SiC board having higher thermal conductivity than a sapphire (Al2O3) board, or use at least one of Si, GaAs, GaP, InP, and Ga2O3.

Figure 5B:
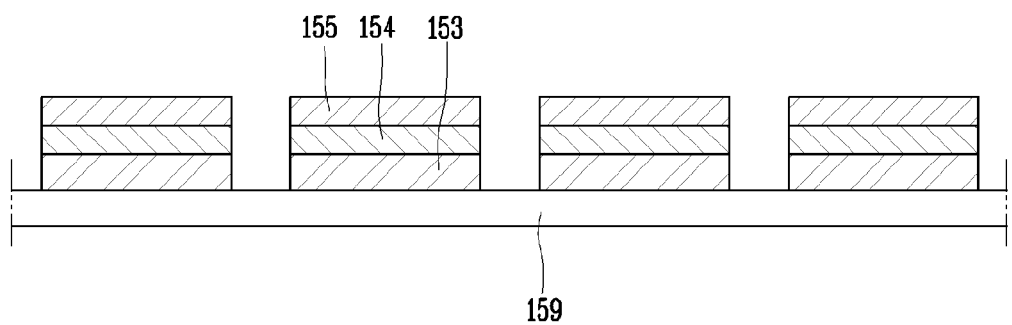

Next, at least a portion of the first conductivity type semiconductor layer 153, the active layer 154, and the second conductivity type semiconductor layer 155 are removed to form a plurality of semiconductor light emitting diodes (FIG. 5B).

More specifically, isolation is performed such that the plurality of light emitting diodes form a light emitting diode array. That is, the first conductivity type semiconductor layer 153, the active layer 154, and the second conductivity type semiconductor layer 155 are vertically etched to form a plurality of semiconductor light emitting diodes.

In the case of forming a horizontal type semiconductor light emitting diode, a mesa process in which the active layer 154 and the second conductivity type semiconductor layer 155 are partially removed in the vertical direction and the first conductivity type semiconductor layer 153 is exposed to the outside and thereafter, isolation in which the first conductivity type semiconductor layer is etched to form a plurality of semiconductor light emitting diode arrays may be performed.

Figure 5C:
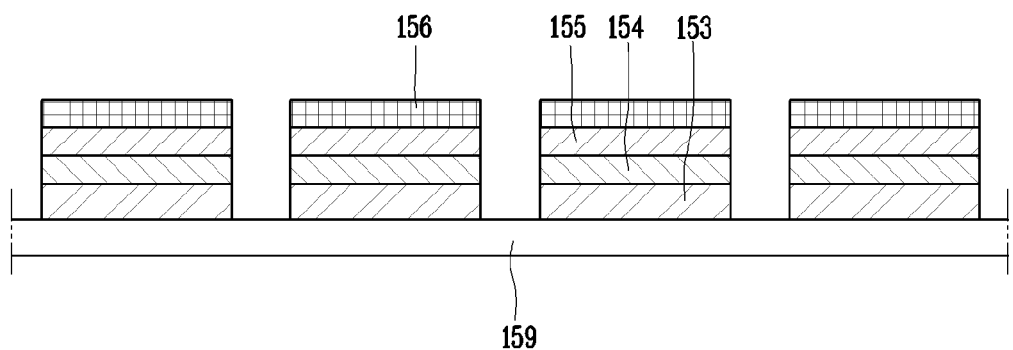

Next, second conductivity type electrodes 156 (or p-type electrodes) are formed on one surface of the second conductivity type semiconductor layer 155 (FIG. 5C). The second conductivity type electrode 156 may be formed by a deposition method such as sputtering, but the present disclosure is not limited thereto. However, when the first conductive semiconductor layer and the second conductive semiconductor layer are an n-type semiconductor layer and a p-type semiconductor layer, respectively, the second conductivity type electrode 156 may be an n-type electrode.

Figure 5D:
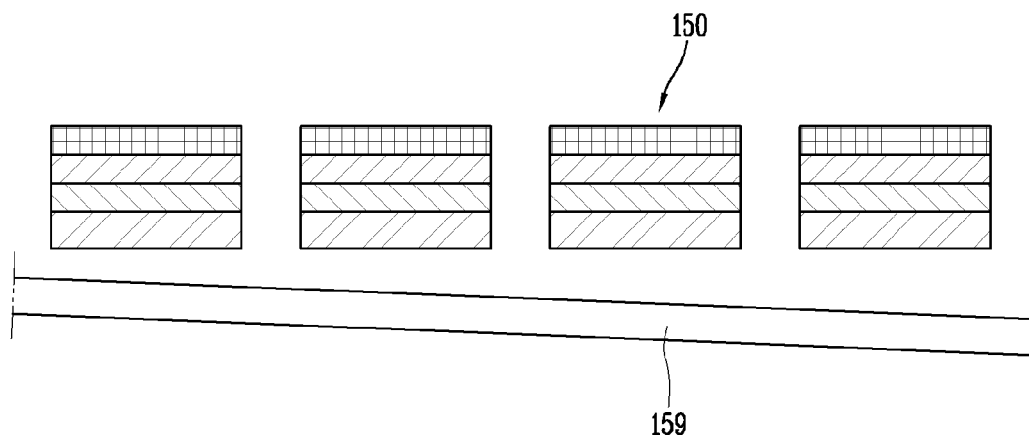

Then, the growth substrate 159 is removed to provide a plurality of semiconductor light emitting diodes. For example, the growth substrate 159 may be removed using a laser lift-off (LLO) method or a chemical lift-off (CLO) method (FIG. 5D).

Figure 5E:
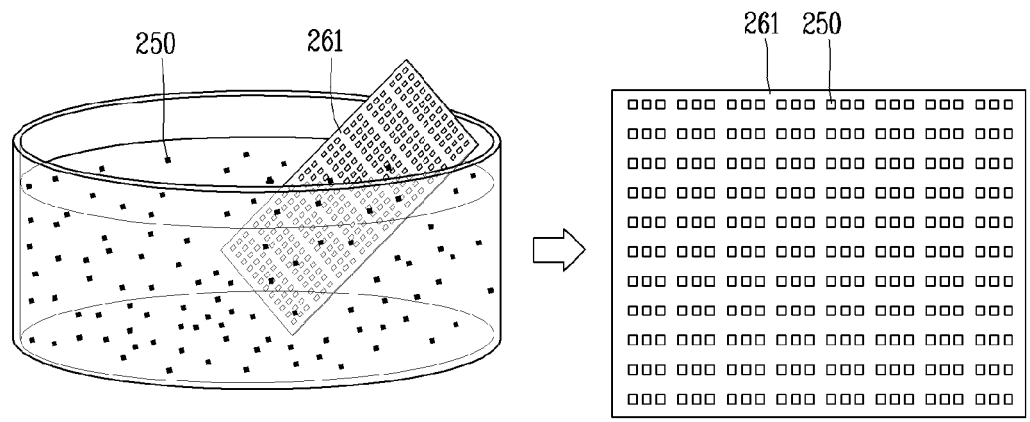

Thereafter, the semiconductor light emitting diodes 150 are seated on a board in a chamber filled with a fluid (FIG. 5E).

For example, the semiconductor light emitting diodes 150 and the board are put in the chamber filled with a fluid, and the semiconductor light emitting diodes are self-assembled onto the board 161 using flow, gravity, surface tension, and the like. In this case, the board may be an assembled board 161.

As another example, it is also possible to put the wiring board in a fluid chamber instead of the assembly board 161 so that the semiconductor light emitting diodes 150 are directly seated on the wiring board. In this case, the board may be a wiring board. However, for convenience of description, in the present disclosure, the board is provided as, for example, the assembly board 161 on which the semiconductor light emitting diodes 1050 are seated.

Cells (not shown) in which the semiconductor light emitting diodes 150 are inserted may be provided in the assembly board 161 to facilitate mounting of the semiconductor light emitting diodes 150 on the assembly board 161. Specifically, cells in which the semiconductor light emitting diodes 150 are seated are formed in the assembly board 161 at positions where the semiconductor light emitting diodes 150 are to be aligned with wiring electrodes. The semiconductor light emitting diodes 150 are assembled to the cells while moving in the fluid.

After a plurality of semiconductor light emitting diodes are arrayed on the assembly board 161, the semiconductor light emitting diodes of the assembly board 161 are transferred to a wiring board, enabling large-area transfer. Accordingly, the assembly board 161 may be referred to as a temporary board.

On the other hand, in order to apply the self-assembly method described above to the manufacture of a large-screen display, it is necessary to increase transfer yield. The present disclosure proposes a method and apparatus for minimizing the influence of gravity or frictional force and preventing non-specific binding in order to increase the transfer yield.

In this case, in the display device according to the present disclosure, a magnetic material is disposed on the semiconductor light emitting diode to move the semiconductor light emitting diode using magnetic force, and the semiconductor light emitting diode is seated at a predetermined position by using an electric field during movement. Hereinafter, the transfer method and apparatus will be described in more detail with the accompanying drawings.

Figure 6:
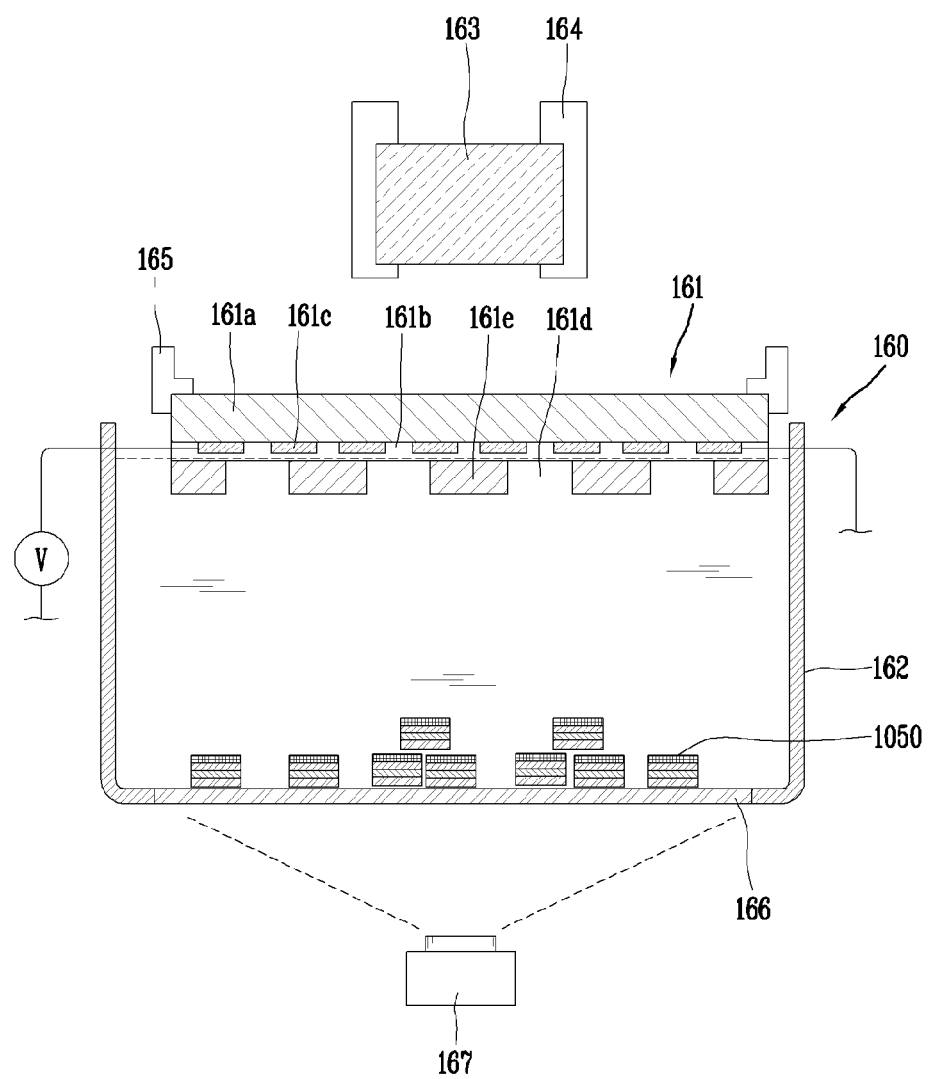
FIG. 6 is a conceptual diagram illustrating an example of a self-assembly apparatus of a semiconductor light emitting diode according to the present disclosure.
Figure 7:
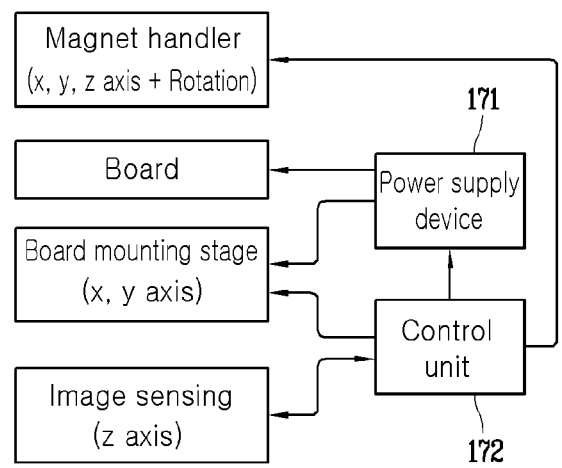
FIG. 7 is a block diagram of the self-assembly apparatus of FIG. 6.

FIG. 6 is a conceptual diagram illustrating an example of a self-assembly apparatus of a semiconductor light emitting diode according to the present disclosure, and FIG. 7 is a block diagram of the self-assembly apparatus of FIG. 6. FIGS. 8A to 8E are conceptual views illustrating a process of self-assembling a semiconductor light emitting diode using the self-assembly apparatus of FIG. 6, and FIG. 9 is a conceptual diagram for describing the semiconductor light emitting diode of FIGS. 8A to 8E.

Referring to FIGS. 6 and 7, a self-assembly apparatus 160 of the present disclosure may include a fluid chamber 162, a magnet 163 and a position control unit 164.

The fluid chamber 162 has a space for accommodating a plurality of semiconductor light emitting diodes. The space may be filled with a fluid, and the fluid may include water or the like as an assembly solution. Accordingly, the fluid chamber 162 may be a water tank and may be configured in an open type. However, the present disclosure is not limited thereto, and the fluid chamber 162 may be of a closed type in which the space is a closed space.

The board 161 may be disposed in the fluid chamber 162 such that an assembly surface on which the semiconductor light emitting diodes 150 are assembled faces downward. For example, the board 161 may be transferred to an assembly position by a transfer device, and the transfer device may include a stage 165 on which the board is mounted. The position of the stage 165 is controlled by the control unit, and through this, the board 161 may be transferred to the assembly position.

In this case, in the assembly position, the assembly surface of the board 161 faces the bottom of the fluid chamber 150. As shown, the assembly surface of the board 161 is disposed to be immersed in the fluid in the fluid chamber 162. Accordingly, the semiconductor light emitting diode 150 moves to the assembly surface in the fluid.

The board 161 is an assembly board in which an electric field is able to be formed, and may include a base portion 161a, a dielectric layer 161b, and a plurality of electrodes 161c. The base portion 161a may be formed of an insulating material, and the plurality of electrodes 161c may be a thin or thick bi-planar electrode patterned on one surface of the base portion 161a. The electrode 161c may be formed of, for example, a stack of Ti/Cu/Ti, Ag paste, and ITO.

The dielectric layer 161b may be formed of an inorganic material such as SiO2, SiNx, SiON, Al2O3, TiO2, HfO2, or the like. Alternatively, the dielectric layer 161b may be comprised of a single layer or a multi-layer as an organic insulator. The dielectric layer 161b may have a thickness of several tens of nm to several μm.

Furthermore, the board 161 according to the present disclosure includes a plurality of cells 161d separated by barrier ribs. The cells 161d are sequentially arranged in one direction and may be made of a polymer material. Also, the barrier ribs 161e defining the cells 161d are shared with the neighboring cells 161d. The barrier ribs 161e may protrude from the base portion 161a, and the cells 161d may be sequentially arranged along one direction by the barrier ribs 161e. More specifically, the cells 161d are sequentially arranged in the column and row directions, respectively, and may have a matrix structure.

As shown, the cell 161d may have a groove for accommodating the semiconductor light emitting diode 150 and the groove may be a space defined by the barrier ribs 161e. The shape of the groove may be the same as or similar to that of the semiconductor light emitting diode. For example, when the semiconductor light emitting diode has a rectangular shape, the groove may have a rectangular shape. Also, although not shown, when the semiconductor light emitting diode has a circular shape, the groove formed in the cells may have a circular shape. Furthermore, each of the cells is configured to accommodate a single semiconductor light emitting diode. That is, one semiconductor light emitting diode is accommodated in one cell.

Meanwhile, the plurality of electrodes 161*c* may include a plurality of electrode lines disposed at the bottom of each of the cells 161*d*, and the plurality of electrode lines may extend to adjacent cells.

The plurality of electrodes 161*c* are disposed below the cells 161*d*, and different polarities are applied to the electrodes 161*c* to generate an electric field in the cells 161*d*. To form the electric field, the dielectric layer may form the bottom of the cells 161*d* while the dielectric layer is covering the plurality of electrodes 161*c*. In this structure, when different polarities are applied to the pair of electrodes 161*c* under the cells 161*d*, an electric field is formed, and the semiconductor light emitting diodes may be inserted into the cells 161*d* due to the electric field.

In the assembly position, the electrodes of the board 161 are electrically connected to a power supply device 171. The power supply device 171 may apply power to the plurality of electrodes to generate the electric field.

As shown, the self-assembly apparatus may include a magnet 163 for applying a magnetic force to the semiconductor light emitting diodes. The magnet 163 is spaced apart from the fluid chamber 162 to apply a magnetic force to the semiconductor light emitting diodes 150. The magnet 163 may be disposed to face the opposite surface of the assembly surface of the board 161, and the position of the magnet is controlled by the position control unit 164 connected to the magnet 163.

The semiconductor light emitting diode 1050 may include a magnetic material to move in the fluid due to the magnetic field of the magnet 163.

Referring to FIG. 9, a semiconductor light emitting diode including a magnetic material may include a first conductivity type electrode 1052, a second conductivity type electrode 1056, a first conductivity type semiconductor layer 1053 on which the first conductivity type electrode 1052 is disposed, a second conductivity type semiconductor layer 1055 on which the second conductivity type electrode 1056 is disposed, the second conductivity type semiconductor layer 1055 overlapping the first conductivity type semiconductor layer 1052 and an active layer 1054 disposed between the first and second conductivity type semiconductor layers 1053 and 1055.

Here, the first conductivity type may be p-type, the second conductivity type may be n-type, and vice versa. In addition, as described above, the semiconductor light emitting diode having no active layer may be used.

Meanwhile, in the present disclosure, the first conductivity type electrode 1052 may be generated after the semiconductor light emitting diode is assembled to the wiring board through self-assembly of the semiconductor light emitting diode. Also, in the present disclosure, the second conductivity type electrode 1056 may include the magnetic material. The magnetic material may mean a magnetic metal. The magnetic material may be Ni, SmCo, or the like, and as another example, may include a material corresponding to at least one of Gd-based, La-based, and Mn-based materials.

The magnetic material may be provided in the second conductivity type electrode 1056 in the form of particles. Alternatively, the conductivity type electrode including a magnetic material may have one layer formed of a magnetic material. For this example, as shown in FIG. 9, the second conductivity type electrode 1056 of the semiconductor light emitting diode 1050 may include a first layer 1056*a* and a second layer 1056*b*. Here, the first layer 1056*a* may include a magnetic material, and the second layer 1056*b* may include a metal material rather than a magnetic material.

As shown, in this example, the first layer 1056*a* including a magnetic material may be disposed to contact the second conductivity type semiconductor layer 1055. In this case, the first layer 1056*a* is disposed between the second layer 1056*b* and the second conductivity type semiconductor layer 1055. The second layer 1056*b* may be a contact metal connected to the second electrode of the wiring board. However, the present disclosure is not necessarily limited thereto, and the magnetic material may be disposed on one surface of the first conductivity type semiconductor layer.

Referring back to FIGS. 6 and 7, more specifically, the self-assembly apparatus is provided with a magnet handler that is movable automatically or manually in the x, y, and z axes on the upper portion of the fluid chamber, or a motor capable of rotating the magnet 163. The magnet handler and the motor may constitute the position control unit 164. Through this, the magnet 163 may rotate in a horizontal direction with the board 161, clockwise or counterclockwise direction.

Meanwhile, a bottom plate 166 having a light-transmitting property may be formed in the fluid chamber 162, and the semiconductor light emitting diodes may be disposed between the bottom plate 166 and the board 161. An image sensor 167 may be disposed to face the bottom plate 166 to monitor the inside of the fluid chamber 162 through the bottom plate 166. The image sensor 167 is controlled by the control unit 172 and may include an inverted type lens, a CCD and the like to observe the assembly surface of the board 161.

The self-assembly apparatus described above is configured to use a combination of a magnetic field and an electric field, and when using this, the semiconductor light emitting diodes may be seated at predetermined positions on the board due to an electric field while moving by a change in the position of the magnet. Hereinafter, an assembly process using the self-assembly apparatus described above will be described in more detail.

First, a plurality of semiconductor light emitting diodes 1050 including a magnetic material are formed through the process described with reference to FIGS. 5A to 5C. In this case, in the process of forming the second conductivity type electrode of FIG. 5C, a magnetic material may be deposited on the semiconductor light emitting diode.

Figure 8A:
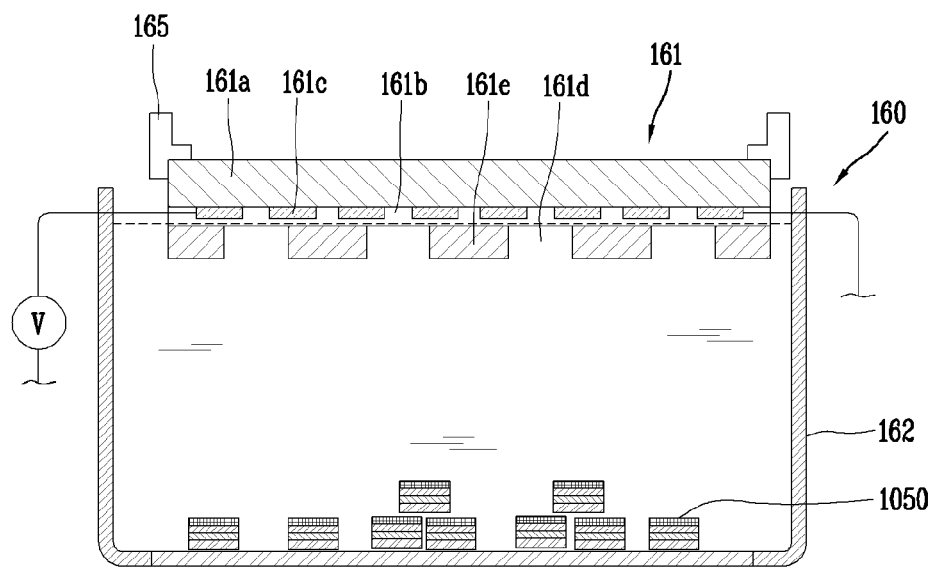
FIGS. 8A to 8E are conceptual views illustrating a process of self-assembling a semiconductor light emitting diode using the self-assembly apparatus of FIG. 6.
Figure 9:
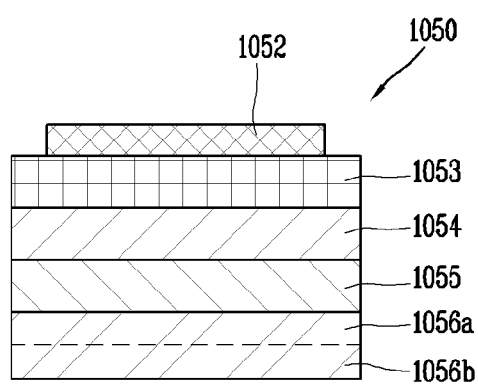
FIG. 9 is a conceptual diagram for describing the semiconductor light emitting diode of FIGS. 8A to 8E.

Next, the board 161 is transferred to an assembly position, and the semiconductor light emitting diodes 1050 are put into the fluid chamber 162 (FIG. 8A).

As described above, the assembly position of the board 161 may be a position in which the board 161 is to be disposed in the fluid chamber 162 such that the assembly surface of the board 161 on which the semiconductor light emitting diodes 1050 are to be assembled faces downward.

In this case, some of the semiconductor light emitting diodes 1050 may sink to the bottom of the fluid chamber 162 and some may float in the fluid. The bottom plate 166 having a light-transmitting property is provided in the fluid chamber 162, and some of the semiconductor light emitting diodes 1050 may sink to the bottom plate 166.

Figure 8B:
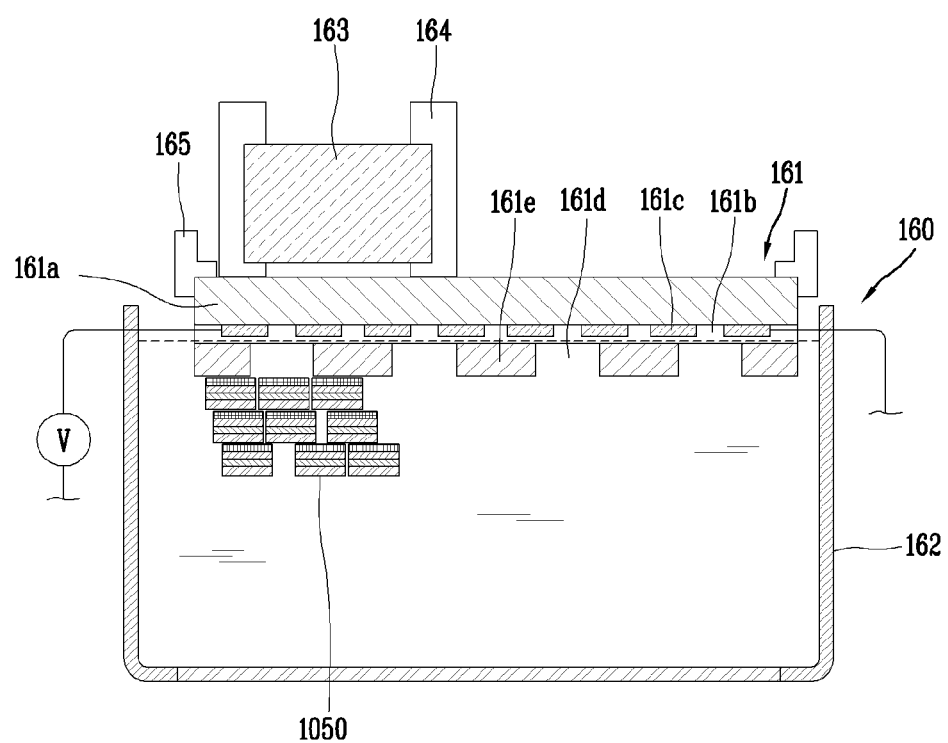

Next, a magnetic force is applied to the semiconductor light emitting diodes 1050 such that the semiconductor light emitting diodes 1050 vertically float in the fluid chamber 162 (FIG. 8B)

When the magnet 163 of the self-assembly apparatus moves from its original position to the opposite surface of the assembly surface of the board 161, the semiconductor light emitting diodes 1050 may float toward the board 161 in the fluid. The original position may be a position deviated from the fluid chamber 162. As another example, the magnet 163 may be made of an electromagnet. In this case, electricity is supplied to the electromagnet to generate an initial magnetic force.

Meanwhile, in this example, when the magnitude of the magnetic force is adjusted, the separation distance between the assembly surface of the board 161 and the semiconductor light emitting diodes 1050 may be controlled. For example, the separation distance is controlled using the weight, buoyancy, and magnetic force of the semiconductor light emitting diodes 1050. The separation distance may be several millimeters to several tens of micrometers from the outermost edge of the board.

Figure 8C:
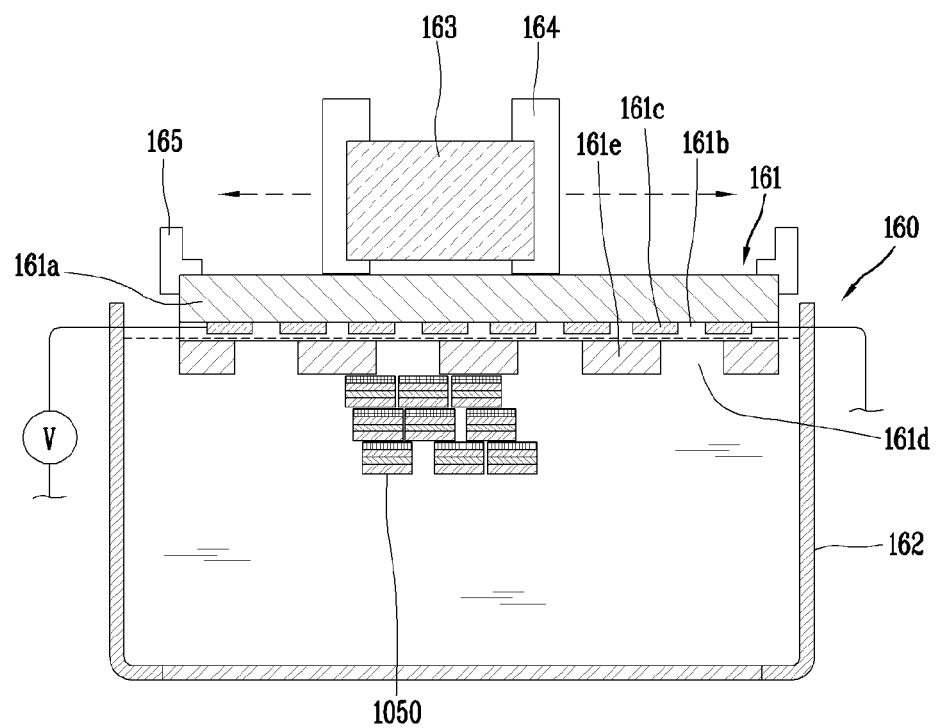

Next, a magnetic force is applied to the semiconductor light emitting diodes 1050 such that the semiconductor light emitting diodes 1050 move in one direction in the fluid chamber 162. For example, it is possible to move the magnet 163 in a direction horizontal to the board, clockwise or counterclockwise (FIG. 8C). In this case, the semiconductor light emitting diodes 1050 move in a direction parallel to the board 161 from positions spaced apart from the board 161 due to the magnetic force.

Next, an electric field is applied to guide the semiconductor light emitting diodes 1050 to preset positions such that the semiconductor light emitting diodes 1050 are seated in the preset positions of the board 161 while the semiconductor light emitting diodes 1050 are moving (FIG. 8C). For example, while the semiconductor light emitting diodes 1050 are moving in a direction horizontal to the board 161, the semiconductor light emitting diodes 1050 may move in a direction perpendicular to the board 161 due to the electric field, and be then seated in the preset positions of the board 161.

More specifically, an electric field is generated by supplying power to the bi-planar electrode of the board 161 to enable assembly to be made only at preset positions. That is, the semiconductor light emitting diodes 1050 are self-assembled at assembly positions of the board 161 by using the selectively generated electric field. To this end, cells in which the semiconductor light emitting diodes 1050 are inserted may be provided in the board 161.

Thereafter, a process of unloading the board 161 is performed, and the assembly process is finished. When the board 161 is an assembly board, a post-process for realizing a display device by transferring the semiconductor light emitting diodes arranged as described above to a wiring board may be performed.

Figure 8D:
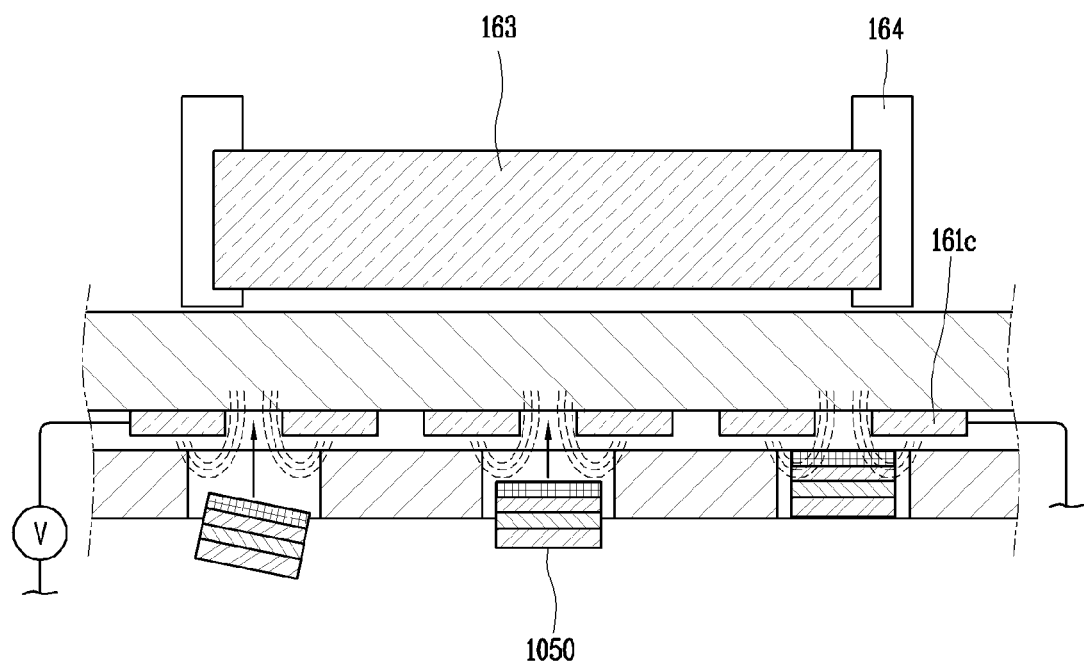
Figure 8E:
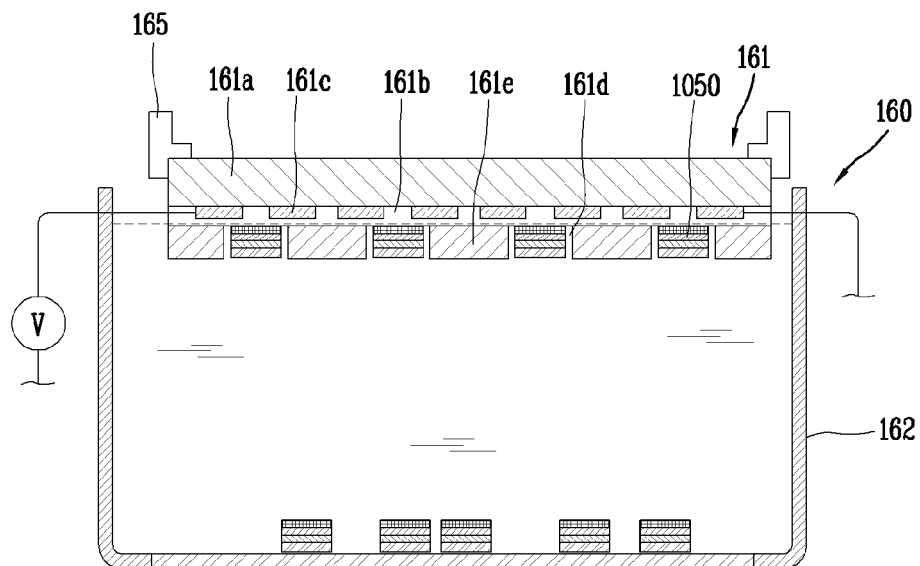

Meanwhile, after guiding the semiconductor light emitting diodes 1050 to the preset positions, the magnet 163 may be moved in a direction away from the board 161 such that the semiconductor light emitting diodes 1050 remaining in the fluid chamber 162 fall to the bottom of the fluid chamber 162 (FIG. 8D). As another example, when power supply is stopped in a case where the magnet 163 is an electromagnet, the semiconductor light emitting diodes 1050 remaining in the fluid chamber 162 may fall to the bottom of the fluid chamber 162.

Thereafter, when the semiconductor light emitting diodes 1050 at the bottom of the fluid chamber 162 are recovered, the recovered semiconductor light emitting diodes 1050 may be reused.

The self-assembly apparatus and method described above may use a magnetic field to enable distant parts to congregate near a predetermined assembly site and apply a separate electric field to the assembly site such that the parts are selectively assembled only to the assembly site in order to increase the assembly yield in fluidic assembly. In this case, the assembly board is placed on the upper portion of the water tank and the assembly surface is directed downward to minimize the effect of gravity due to the weight of the parts and prevent non-specific binding to eliminate defects. That is, to increase the transfer yield, the assembly board is placed on the upper portion to minimize the effect of gravity or frictional force, and to prevent non-specific binding.

As described above, according to the present disclosure having the above configuration, in a display device in which individual pixels are formed of semiconductor light emitting diodes, a large number of semiconductor light emitting diodes may be assembled at once.

As described above, according to the present disclosure, it is possible to pixelate a large amount of semiconductor light emitting diodes on a small-sized wafer and then transfer the semiconductor light emitting diodes to a large-area substrate. Through this, it is possible to manufacture a large-area display device at a low cost.

Hereinafter, a display device using a semiconductor light emitting diode having a novel structure according to an embodiment of the present disclosure will be described with reference to the accompanying drawings.

The display device 2000 described in this specification may be implemented in a passive matrix method (hereinafter, PM method) or an active matrix method (hereinafter referred to as AM method).

First, a structure of the conventional display device 200 will be described with reference to FIG. 10.

Figure 10:
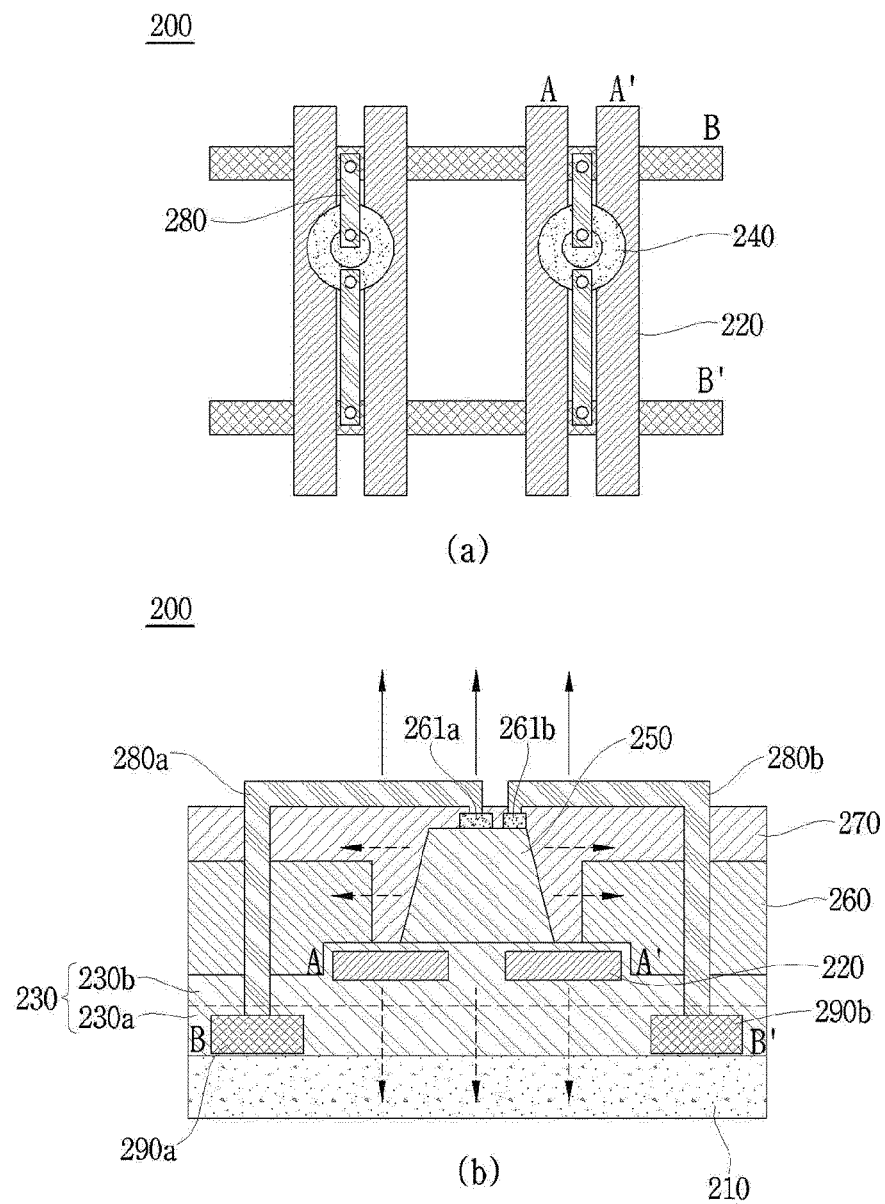
FIG. 10 is a conceptual diagram illustrating a conventional front light emitting display device.

FIG. 10 is a conceptual diagram illustrating a conventional front light emitting display device.

Referring to FIG. 10, the conventional display device 200 has a front light emitting structure that emits light generated in the active layer (or light emitting layer) of the semiconductor light emitting diode 260 to the front surface (the upper part of the semiconductor light emitting diode 260 based on the drawing).

The reason for having a front light emitting structure is that the semiconductor light emitting diode 260 seated in the cell 240 overlaps the metal assembled electrode 220 provided to form an electric field during self-assembly, and thus the area through which the light generated in the active layer of the semiconductor light emitting diode 260 can pass through the back surface is very small.

However, there was a problem in that even by front emission about 50% of the light generated in the active layer of the semiconductor light emitting diode 260 was lost by a magnetic layer of the semiconductor light emitting diode 260 and a metal connection electrode 280. The magnetic layer (for example, a ring-shaped nickel layer) of the semiconductor light emitting diode 260 may allow the semiconductor light emitting diode 260 to be induced by a magnetic field during self-assembly. The metal connection electrode 280 may connect the semiconductor light emitting diode 260 seated in the cell 240 and the wiring electrode 290 formed on the base portion 210 for lighting of the semiconductor light emitting diode 260.

The present disclosure relates to a display device 2000 having a structure capable of back light emission that solves problems of the conventional display device 200.

Figure 11:
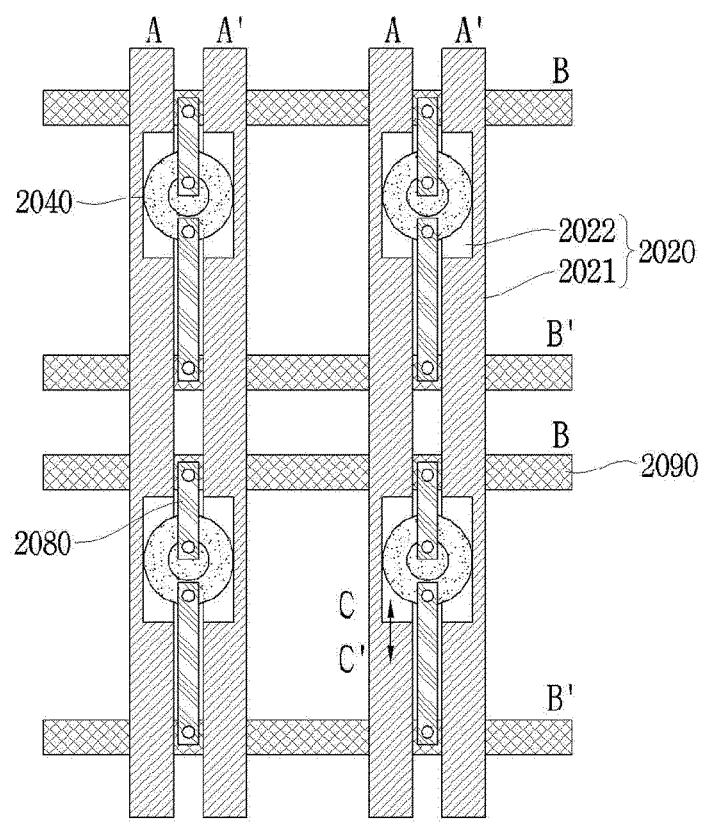
FIG. 11 is a conceptual diagram illustrating a display device according to the present disclosure.
Figure 12:
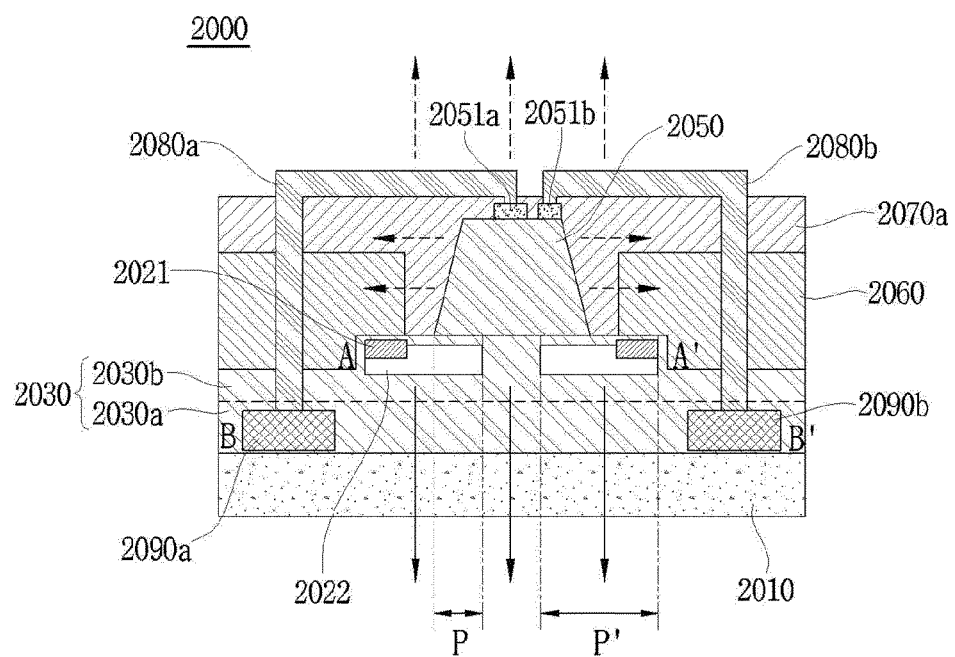
FIG. 12 is a conceptual diagram illustrating a display device according to an embodiment of the present disclosure.
Figure 13:
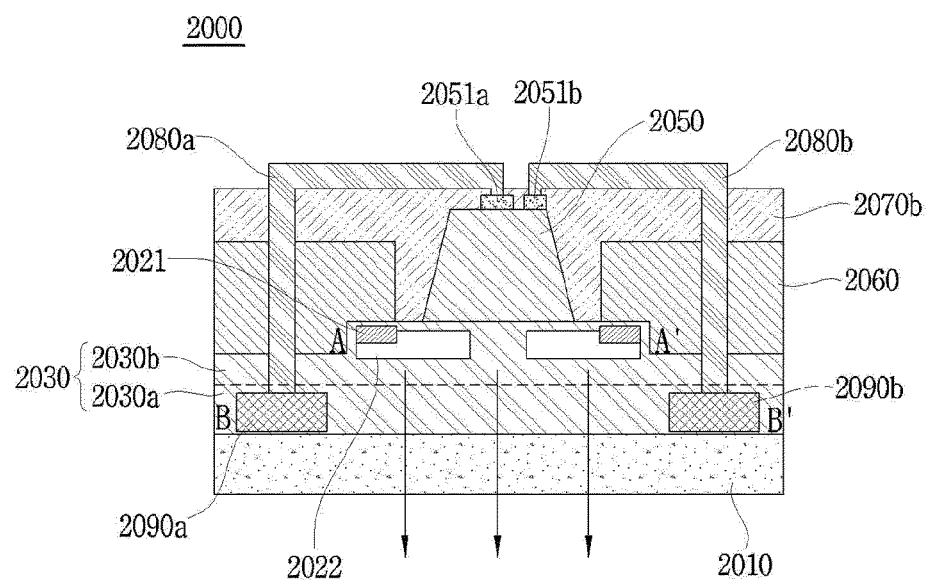
FIG. 13 is a conceptual diagram illustrating a display device according to another embodiment of the present disclosure.

FIG. 11 is a conceptual diagram illustrating a display device according to the present disclosure, FIG. 12 is a conceptual diagram illustrating a display device according to an embodiment of the present disclosure, and FIG. 13 is a conceptual diagram illustrating a display device according to another embodiment of the present disclosure. In addition, FIGS. 12 and 13 are cross-sectional views taken along AA' and BB' of FIG. 11.

The display device 2000 according to an embodiment of the present disclosure may include assembled electrodes 2020, a dielectric layer 2030, a semiconductor light emitting diode 2050 assembled in a cell 2040, a partition wall portion 2060, a planarization layer 2070, a wiring electrode 2090, and the like on a base portion 2010.

The base portion 2010 may be a rigid substrate such as glass and quartz, or a flexible substrate including a polymer material.

As the polymer material, for example, a material including flexible and insulating polyimide (PI), polyethylene naphthalate (PEN), polyethylene terephthalate (PET), or the like may be used.

Furthermore, according to an embodiment of the present disclosure, since the light generated by the semiconductor light emitting diode 2050 is emitted to the rear surface, the base portion 2010 may be formed of a light-transmitting material.

Assembled electrodes 2020 extending in one direction may be formed on the base portion 2010. The assembled electrodes 2020 may be formed to a thickness of several hundred nm.

According to an embodiment of the present disclosure, the assembled electrodes 2020 may include a metal electrode portion 2021 formed of a metal material and a transparent electrode portion 2022 formed of a transparent material.

Specifically, the assembled electrode 2020 may be formed by connecting the metal electrode portion 2021 and the transparent electrode portion 2022 to each other.

The metal electrode portion 2021 may serve to transmit a voltage signal applied to the assembled electrode 2020 to form an electric field, and thus, the metal electrode portion 2021 can be formed continuously along the direction in which the assembled electrode 2020 is extended.

The metal electrode portion 2021 may be formed of a non-resistive metal corresponding to any one of Al, Mo, Cu, Ag, and Ti, or an alloy selected from these, in order to transmit signals. The specific resistance of the metal used for the metal electrode portion 2021 may be preferably $1E^{-6}$ to $5E^{-5}$ (ohm·cm) level.

The transparent electrode portion 2022 may serve to transmit the light generated by the semiconductor light emitting diode 2050 and emit the light to the outside.

For example, indium Tin Oxide (ITO), Al-doped Zinc Oxide (AZO), F-doped Tin Oxide (FTO), or the like may be used as the transparent electrode portion 2022.

According to an embodiment of the present disclosure, the transparent electrode portion 2022 may be formed in at least a region (P of FIG. 12) overlapping the semiconductor light emitting diode 2050. Accordingly, even though the light generated by the semiconductor light emitting diode 2050 is directed toward the assembled electrode 2020, since the light is transmitted through the transparent electrode portion 2022, the amount of light loss may be reduced.

Preferably, the transparent electrode portion 2022 may be formed up to a region overlapping the cell 2040 (P' in FIG. 12) or the circumferential portion thereof. In other words, the cell 2040 may overlap the transparent electrode portion 2022 of the assembled electrode 2020.

Meanwhile, the assembled electrodes 2020 may include a connection portion 2023 formed so that the metal electrode portion 2021 and the transparent electrode portion 2022 overlap each other at the boundary thereof.

Figure 14:
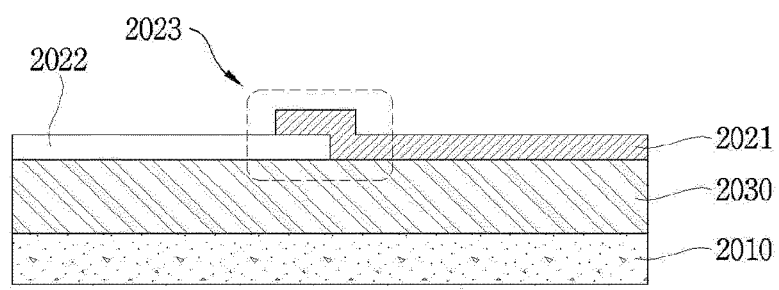
FIG. 14 is an enlarged view of a connection portion of an assembled electrode according to an embodiment of the present disclosure.

FIG. 14 is an enlarged view of a connection portion of an assembled electrode according to an embodiment of the present disclosure.

The connection portion 2023 may be formed such that the metal electrode portion 2021 covers a portion of the upper surface of the transparent electrode portion 2022 as illustrated in FIG. 14. The material forming the metal electrode portion 2021 has excellent step coverage and has ductile so that the metal electrode portion is not easily broken even when a step occurs, and the transparent electrode portion 2022 is not damaged by a metal etching solution during metal electrode patterning and thus there is an advantage of being able to pattern freely.

On the other hand, the transparent electrode portion 2022 is prone to cracks in the stepped portion due to the characteristics of the material, and the metal electrode portion 2021 may be damaged by the etching solution used for patterning the transparent electrode.

Accordingly, the connection portion 2023 may have a structure in which the metal electrode portion 2021 covers the transparent electrode portion 2022 as illustrated in FIG. 14.

The assembled electrode 2020 according to the embodiment of the present disclosure is formed by patterning the transparent electrode portion 2022 on the base portion 2010 and forming the metal electrode portion 2021 to cover the transparent electrode portion 2022, and thus when the metal electrode portion 2021 is patterned, the assembled electrode 2020 may be formed by etching a partial region overlapping the transparent electrode portion 2022 together. In this case, for selective etching, a wet etching method using an etching solution may be used.

A dielectric layer 2030 may be formed on the base portion 2010 to cover the assembly electrodes 2020. For example, the dielectric layer 2030 may be made of an inorganic insulating material such as $SiO_2$, $SiN_x$, SiON, $Al_2O_3$, $TiO_2$, $HfO_2$, or the like.

In addition, the dielectric layer 2030 may be formed as a single layer or as a multi-layer. For example, in a case where a wiring electrode 2090, which will be described later, is disposed under the semiconductor light emitting device 2050, the dielectric layer 2030 may be formed as a multi-layer of the first dielectric layer 2030*a* covering the wiring electrode 2090 and the second dielectric layer 2030*b* covering the assembled electrode 2020 to electrically insulate the assembled electrode 2020 and the wiring electrode 2090.

A partition wall portion 2060 may be stacked on the dielectric layer 2030 to form a plurality of cells 2040. The plurality of cells 2040 may be formed in a matrix arrangement, and the semiconductor light emitting devices 2050 may be seated inside the cells 2040 through self-assembly. For example, the partition wall portion 2060 may be formed of an inorganic or organic insulating material.

In addition, according to an embodiment of the present disclosure, the display device 2000 may further include a planarization layer 2070 formed to cover the partition wall portion 2060 and the semiconductor light emitting diode 2050 seated in the cell 2040.

According to an embodiment of the present disclosure, the planarization layer 2070*a* may be formed of a transparent organic film material (see FIG. 12).

According to another embodiment of the present disclosure, the planarization layer 2070*b* may be formed of a white insulator (eg, white ink, white paint) or by being coated with a reflective non-conductive material. According to the embodiment, by forming the planarization layer 2070b with a material having a high reflectance, the light emitted from the front side is reflected to the back side to improve the bottom emission efficiency (refer to FIG. 13).

In addition, a wiring electrode 2090 electrically connected to the semiconductor light emitting diode 2050 may be formed on the base portion 2010. The wiring electrode 2090 may include a first wiring electrode 2090a and a second wiring electrode 2090b which can each be connected to a different electrode of the semiconductor light emitting diode 2050 through electrode connection portions 2080a and 2080b.

The wiring electrode 2090 may be formed in various forms on the base portion 2010 according to the driving method (PM method or AM method) of the display device 2000 or the shape (vertical type or horizontal type) of the semiconductor light emitting diode 2050 and the structure connecting the semiconductor light emitting diode 2050 and the wiring electrode 2090 is also not limited to any one form.

According to an embodiment of the present disclosure, the semiconductor light emitting diode 2050 may be of a horizontal type. Specifically, the semiconductor light emitting diode 2050 may include a first conductivity type electrode, a first conductivity type semiconductor layer on which the first conductivity type electrode is formed, an active layer formed on the first conductivity type semiconductor layer, and a second conductivity type semiconductor layer formed on the active layer, and a second conductivity type electrode spaced apart from and on the second conductivity type semiconductor layer in a horizontal direction.

Referring to the drawings, in a circular symmetrical semiconductor light emitting diode 2050, one of the first and second conductivity type electrodes 2051a and 2051b is formed in the center, and the other may be spaced apart in the horizontal direction in a shape formed along the circumference.

In this case, the first conductivity type electrode 2051a may be a p-type electrode, and the second conductivity type electrode 2051b may be an n-type electrode, and vice versa.

Meanwhile, the first conductivity type electrode 2051a and the second conductivity type electrode 2051b may be connected to different wiring electrodes 2090a and 2090b formed on the base portion 2010 through the electrode connection portions 2080a and 2080b.

Specifically, through etching, a hole exposing a portion of the first and second conductivity type electrodes 2051a and 2051b of the semiconductor light emitting diode 2050 and the via hole exposing a portion of the first and second wiring electrodes 2090a and 2090b are formed and then the semiconductor light emitting diode 2050 and the wiring electrode 2090 may be electrically connected by filling and patterning the aforementioned hole and via hole with a conductive material.

However, such a structure is only an example, and the structure of the display device 2000 according to the present disclosure is not limited thereto.

As described above, there is an effect that, in the display device 2000 according to the embodiment of the present disclosure, the semiconductor light emitting diode 2050 overlaps the transparent electrode portion 2022 of the assembled electrode 2020 to enable bottom light emission, and the light emitting area of the semiconductor light emitting diode 2050 can be used to the maximum.

In addition, according to the embodiment of the present disclosure, there is an effect that, by forming the planariza-tion layer 2070b covering the semiconductor light emitting diode 2050 and the partition wall portion 2060 of a reflective material, the amount of light reflected to the rear surface is maximized to minimize light loss.

The present disclosure described above is not limited to the configuration and method of the above-described embodiments, but the embodiments may be configured by selectively combining all or part of each of the embodiments so that various modifications can be made.

What is claimed is:

1. A display device comprising:
   a base portion;
   assembled electrodes extending in one direction and formed on the base portion;
   a dielectric layer formed to cover the assembled electrodes;
   a partition wall portion on the dielectric layer and configured to form a plurality of cells; and
   semiconductor light emitting diodes seated in each of the plurality of cells,
   wherein each of the assembled electrodes comprises a pair of electrodes,
   wherein each electrode of the pair of the electrodes includes a metal electrode portion formed of a metal material and a transparent electrode portion formed of a transparent material,
   wherein the dielectric layer is between the pair of electrodes and between an upper surface of the transparent electrode portion and a lower surface of a corresponding semiconductor light emitting diode, and
   wherein the metal electrode portion is not overlapped vertically with the corresponding semiconductor light emitting diode.

2. The display device of claim 1, wherein the transparent electrode portion is formed at a region overlapping at least the corresponding semiconductor light emitting diode.

3. The display device of claim 1, wherein a cell of the plurality of cells overlaps the transparent electrode portion of the assembled electrode.

4. The display device of claim 1, wherein the metal electrode portion is continuously formed along each corresponding assembled electrode.

5. The display device of claim 1, wherein each of the assembled electrodes includes a connection portion comprising an overlap between a corresponding metal electrode portion and a corresponding transparent electrode portion.

6. The display device of claim 5, wherein the corresponding metal electrode portion covers a portion of the corresponding transparent electrode portion.

7. The display device of claim 1, wherein each semiconductor light emitting diode comprises:
   a first conductivity type electrode;
   a first conductivity type semiconductor layer on which the first conductivity type electrode is formed;
   an active layer formed on the first conductivity type semiconductor layer;
   a second conductivity type semiconductor layer formed on the active layer; and
   a second conductivity type electrode spaced apart from the first conductivity type electrode in a horizontal direction on the second conductivity type semiconductor layer.

8. The display device of claim 1, further comprising a planarization layer formed to cover the partition wall portion and the semiconductor light emitting diodes.

9. The display device of claim 8, wherein the planarization layer is formed of a white insulator.

10. The display device of claim 8, wherein the planarization layer includes a coating layer formed of a reflective non-conductive material.

11. The display device of claim 1, wherein the base portion is formed of a light-transmitting material.

12. The display device of claim 1, further comprising a wiring electrode formed on the base portion and electrically connected to the semiconductor light emitting diode.

* * * * *